US006595224B2

(12) United States Patent
Miranda et al.

(10) Patent No.: US 6,595,224 B2
(45) Date of Patent: Jul. 22, 2003

(54) BATH SYSTEM WITH SONIC TRANSDUCERS ON VERTICAL AND ANGLED WALLS

(75) Inventors: Henry R. Miranda, Fremont, CA (US); Sharyl Maraviov, Fremont, CA (US)

(73) Assignee: P.C.T. Systems, Inc., Fremont, CA (US)

( * ) Notice: Subject to any disclaimer, the term of this patent is extended or adjusted under 35 U.S.C. 154(b) by 27 days.

(21) Appl. No.: 09/886,358

(22) Filed: Jun. 20, 2001

(65) Prior Publication Data
US 2002/0195133 A1 Dec. 26, 2002

(51) Int. Cl.[7] .................................................. B08B 3/12
(52) U.S. Cl. ........................ 134/186; 134/184; 134/902
(58) Field of Search ........................ 134/902, 1.3, 184, 134/186

(56) References Cited

U.S. PATENT DOCUMENTS

| 5,279,316 | A | * | 1/1994 | Miranda | |
|---|---|---|---|---|---|
| 5,379,785 | A | * | 1/1995 | Ohmori et al. | 134/902 X |
| 5,383,484 | A | * | 1/1995 | Thomas et al. | 134/902 X |
| 5,464,480 | A | * | 11/1995 | Matthews | 134/1.3 |
| 5,813,656 | A | * | 9/1998 | Miranda | |
| 5,865,199 | A | * | 2/1999 | Pedziwiatr et al. | 134/184 |
| 5,911,232 | A | * | 6/1999 | Mokuo et al. | 134/1.3 X |
| 6,098,643 | A | * | 8/2000 | Miranda | 134/902 X |
| 6,138,698 | A | * | 10/2000 | Tanaka et al. | 134/902 X |
| 6,148,833 | A | * | 11/2000 | Tang et al. | 134/902 X |
| 6,189,552 | B1 | * | 2/2001 | Oshinowo | 134/902 X |
| 6,210,510 | B1 | * | 4/2001 | Kern, Jr. et al. | 134/902 X |
| 6,284,055 | B1 | * | 9/2001 | Dryer et al. | 134/902 X |
| 2002/0144709 | A1 | * | 10/2002 | Kashkoush et al. | |

* cited by examiner

Primary Examiner—Philip R. Coe
(74) Attorney, Agent, or Firm—Townsend and Townsend and Crew LLP

(57) ABSTRACT

A bath system for processing semiconductor wafers with an efficient and uniform delivery of sonic energy to the semiconductor wafers. The bath system includes a container (e.g., a quartz container) configured for receiving at least one semiconductor wafer (e.g., a 300 mm diameter semiconductor wafer) and holding processing liquid. The container has two vertical sidewalls and two angled walls, with each of the two angled walls being disposed below one of the vertical sidewalls. The bath system also includes at least one sonic transducer attached to each of the two angled walls. These sonic transducers are arranged so that sonic energy emanating therefrom is directed across the at least one semiconductor wafer during processing. The system further includes at least one sonic transducer attached to each of the vertical sidewalls. The sonic transducers attached to each of the vertical sidewalls are also arranged so that sonic energy therefrom is directed across the at least one semiconductor wafer during processing.

21 Claims, 3 Drawing Sheets

BATH SYSTEM WITH SONIC TRANSDUCERS ON VERTICAL AND ANGLED WALLS

BACKGROUND OF THE INVENTION

1. Field of the Invention

The present invention relates, in general, to the field of bath systems for processing semiconductor wafers and, in particular, to bath systems using sonic energy for processing semiconductor wafers.

2. Description of the Related Art

In conventional bath systems for processing semiconductor wafers, a container is loaded with a cassette of semiconductor wafers and a processing liquid (e.g., a solvent, basic solution, acidic solution or distilled water) is circulated through the container. A development in such bath systems has been the use of sonic transducers to direct sonic energy through the processing liquid and to the semiconductor wafers. This use of sonic energy has been found to not only deliver kinetic energy for "scrubbing" particles from the surfaces of the semiconductor wafers, but to also facilitate desired chemical reactions at the interface between the surface of the semiconductor wafer and the processing liquid.

Conventional bath systems using sonic energy have not, however, had optimal performance. Due to the location of sonic transducers, some conventional bath systems have been inefficient and non-uniform in their delivery of sonic energy to the semiconductor wafers. For example, the presence of a semiconductor wafer cassette in the container can result in a "shadowing" effect where the sonic energy is blocked by cassette support rods from reaching some portions of the semiconductor wafers. Inefficient and non-uniform delivery of sonic energy is worsened when semiconductor wafers of a large diameter (e.g., 300 mm diameter), and thus large area, are placed in the cassette to be cleaned. Furthermore, conventional bath systems typically employ only one generator to power the sonic transducers. Bath systems with a single generator, however, are limited in their ability to power the sonic transducers in a manner that optimizes sonic energy delivery.

Costs are always of concern in semiconductor device fabrication. For such fabrication, several bath systems are typically installed and utilized, each of which can contain different processing liquids. The purchasing cost of several bath systems and the cost of the processing liquids for multiple bath systems can be a significant expense.

Still needed in the field is a bath system for processing semiconductor wafers that provides for the efficient and uniform delivery of sonic energy to the semiconductor wafers. In addition, the bath system should minimize processing time and thus reduce the required number of bath systems, as well as the volume of processing liquid.

BRIEF SUMMARY OF THE INVENTION

The present invention provides a bath system for processing semiconductor wafers with an efficient and uniform delivery of sonic energy to the semiconductor wafers. The bath system minimizes processing time and thus reduces the required number of bath systems, as well as the volume of processing liquid.

The bath system according to one exemplary embodiment of the present invention includes a container (e.g., a quartz container) configured for receiving semiconductor wafers (e.g., a 300 mm diameter semiconductor wafer) and holding processing liquid. The container has two vertical sidewalls and two angled walls, with each of the angled walls being disposed below one of the vertical sidewalls. The bath system includes at least one sonic transducer attached to each of the vertical sidewalls, as well as at least one sonic transducer attached to each of the angled walls. These sonic transducers are arranged so that sonic energy emanating therefrom is directed across the semiconductor wafers during processing. Placement of the sonic transducers on the angles walls is further designed to reduce the "shadowing" effect otherwise present in the conventional bath systems.

A better understanding of the features and advantages of the present invention will be obtained by reference to the following detailed description that sets forth illustrative embodiments, in which the principles of the invention are utilized, and the accompanying drawings.

DETAILED DESCRIPTION OF THE INVENTION

Figure 1:
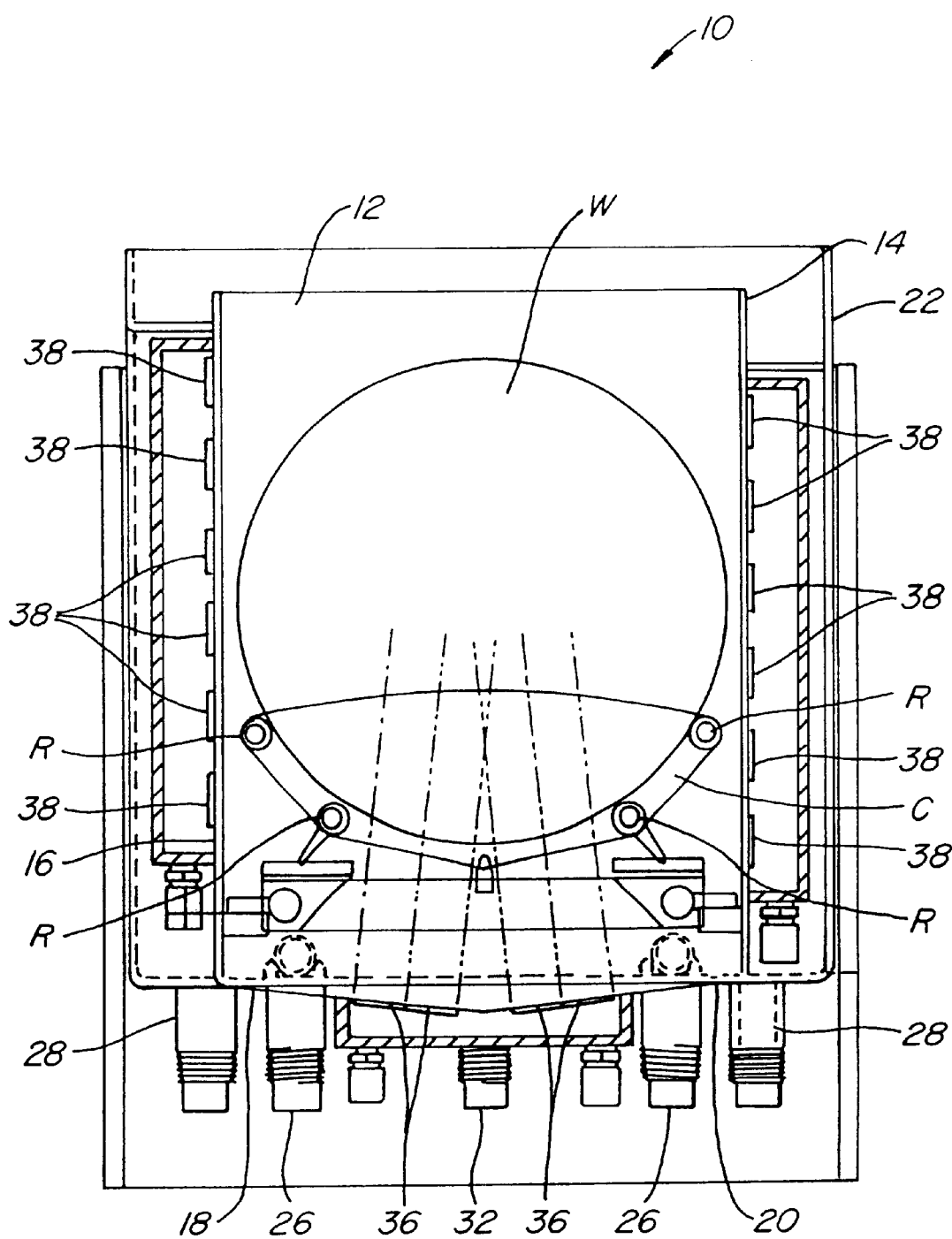
FIG. 1 is a cross-sectional end view of a bath system according to one exemplary embodiment of the present invention.
Figure 2:
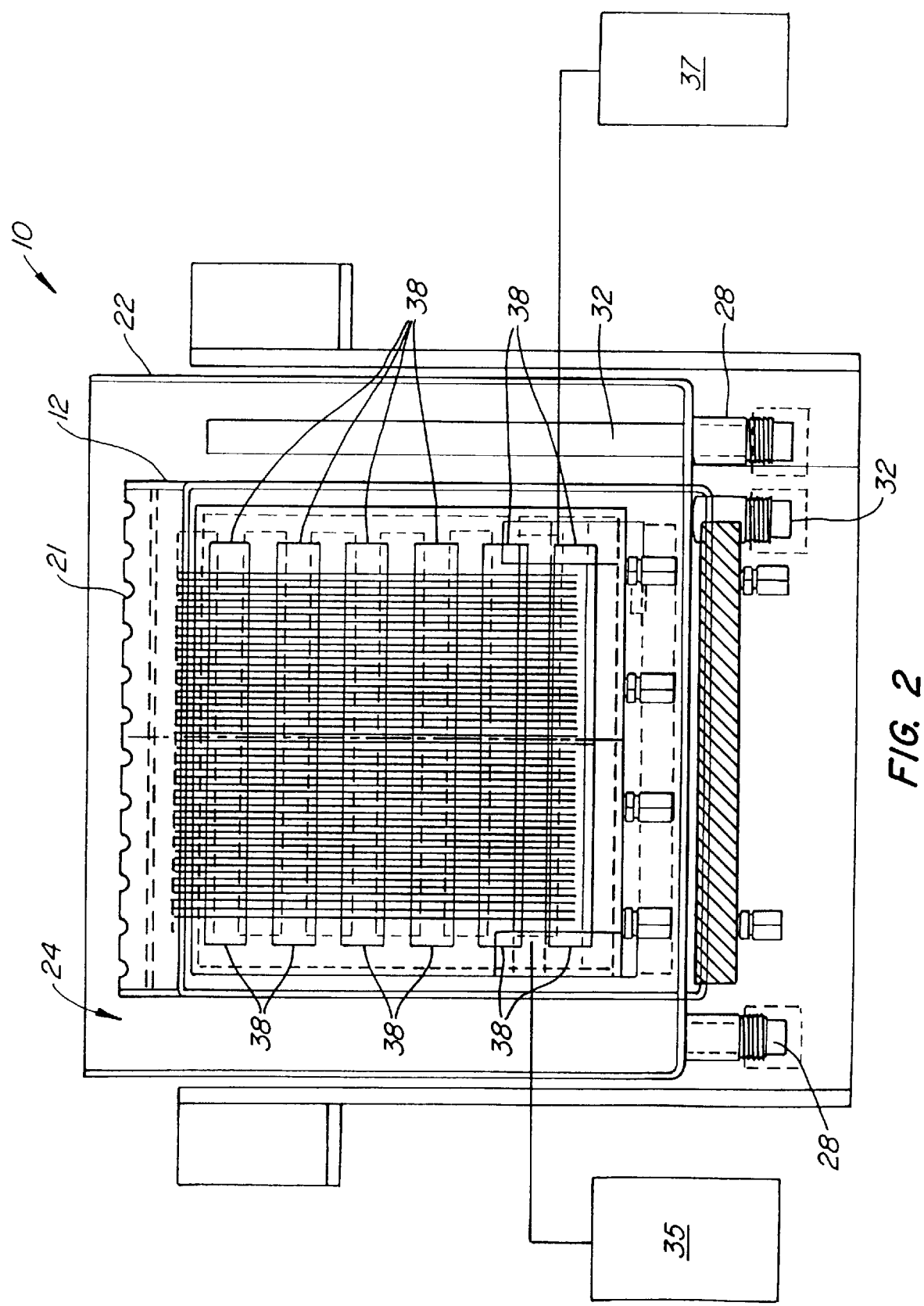
FIG. 2 is a cross-sectional side view of the bath system of FIG. 1.
Figure 3:
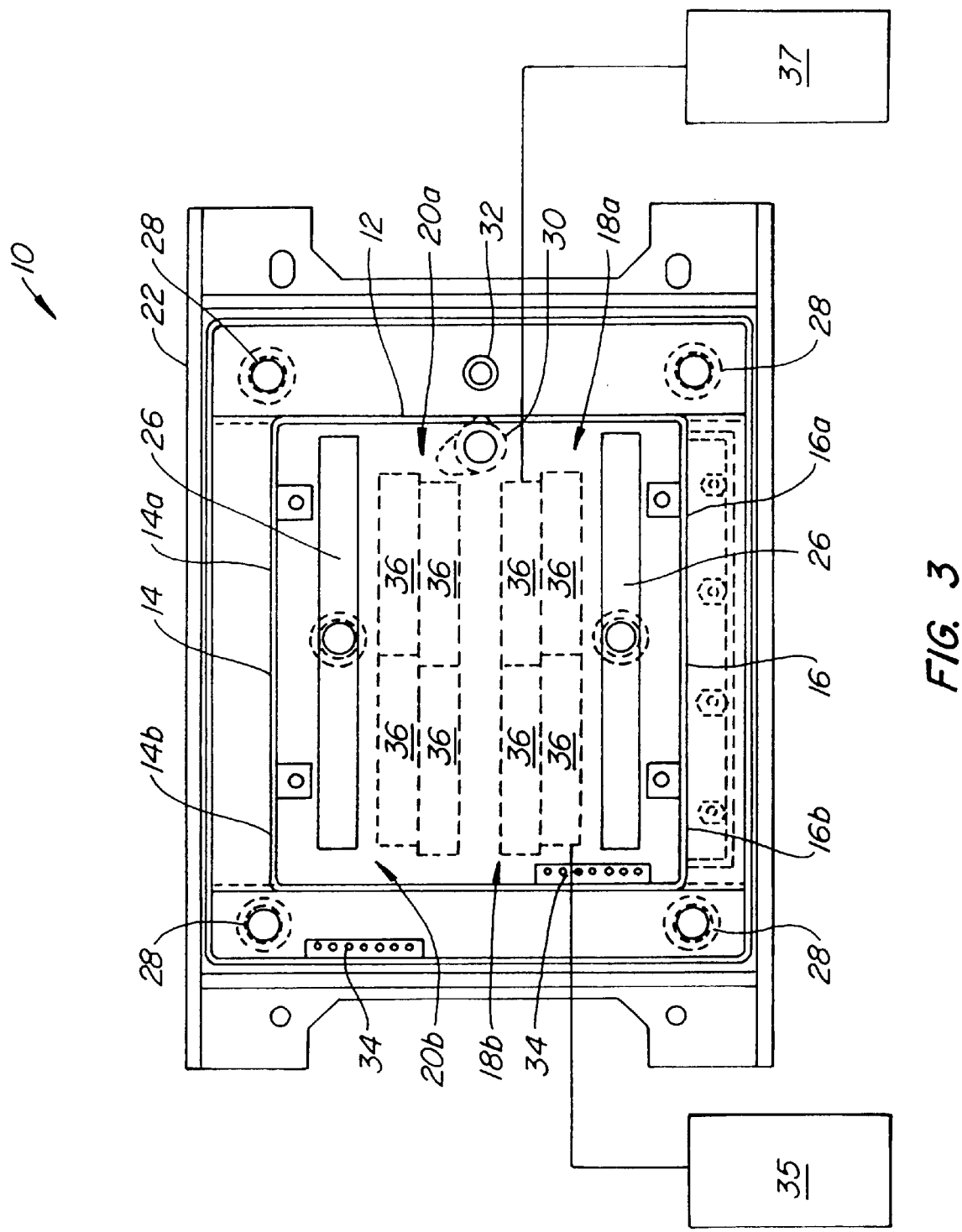
FIG. 3 is a top view of the bath system of FIG. 1.

FIGS. 1 and 2 show cross-sectional end and side views, respectively, of a bath system 10 for processing semiconductor wafers (labeled W in FIG. 1) according to one exemplary embodiment of the present invention. FIG. 3 illustrates a top view of bath system 10 without the semiconductor wafers. Bath system 10 includes a container 12 configured for receiving fifty 300 mm diameter semiconductor wafers in a conventional semiconductor wafer cassette (labeled C in FIG. 1) and holding processing liquid. Although semiconductor wafer cassette C, as shown in the figures, includes four cassette support rods (labeled R in FIG. 1), it is generally known in the art to employ semiconductor wafer cassettes with multiple cassette support rods (e.g., two cassette support rods or three cassette support rods). One skilled in the art will recognize that a container of a bath system according to one exemplary embodiment of the present invention can also be configured to receive semiconductor wafers of a diameter other than 300 mm (e.g., 150 mm or 200 mm) and a different number of semiconductor wafers (e.g., one or fifty-two semiconductor wafers).

Container 12, typically made of quartz, PFA, PVDF, NPP, Halar or combinations thereof, has two vertical sidewalls 14 and 16 and two angled walls 18 and 20. Each of angled walls 18 and 20 is disposed below one of vertical sidewalls 14, 16. Container 12 has an open top with top edges 21 of vertical sidewalls 14 and 16 formed in a zigzag or scalloped pattern. Container 12 is held in a housing 22 that includes re-circulation overflow area 24. Housing 22 is typically made of plastic and is equipped with various types of conventional hardware to facilitate the processing of semiconductor wafers in container 12. Such conventional hardware includes processing liquid inlet manifolds 26, processing liquid re-circulation outlets 28, processing liquid drain 30, safety overflow pipe 32 and brackets 34 adapted for holding, for example, liquid level sensors and liquid tubing. The use and configuration of such conventional hardware is well known to one skilled in the art.

Bath system 10 also includes four sonic transducers 36 attached to each of angled walls 18 and 20 (i.e., a total of eight sonic transducers attached to angled walls 18 and 20, as illustrated in FIGS. 1 and 3). In the embodiment of FIGS. 1–3, two of the four sonic transducers 36 are attached to front portions 18a and 20a of angled walls 18 and 20, respectively, and the other two sonic transducers 36 are attached to back portions 18b and 20b of angled walls 18 and 20, respectively (see FIG. 3). Sonic transducers 36 are arranged so that sonic energy emanating therefrom is directed across the semiconductor wafers during processing. As can be seen in FIG. 1, where the dashed lines illustrate the path of sonic energy from sonic transducers 36, sonic transducers 36 are arranged so that sonic energy is directed between two of the cassette support rods R and across the semiconductor wafers during processing. Such an arrangement of the sonic transducers significantly reduces the "shadowing" effect otherwise present in the conventional bath system.

Bath system 10 of the particular exemplary embodiment illustrated in FIGS. 1–3 further includes twelve sonic transducers 38 attached to each of the vertical sidewalls 14 and 16, with six of the twelve sonic transducers 38 being attached to front portions 14a and 16a of vertical sidewalls 14 and 16, and the other six sonic transducers 38 being attached to back portions 14b and 16b of vertical sidewalls 14 and 16 (i.e., a total of 24 sonic transducers attached to vertical sidewalls 14 and 16). Sonic transducers 38 are arranged so that sonic energy emanating therefrom is directed across the semiconductor wafers during processing. In the embodiment of FIGS. 1–3, sonic transducers 38 are attached to, and arranged on, each of vertical sidewalls 14 and 16 in an offset manner. Since the sonic transducers on vertical sidewall 14 are not directly aligned with any of the sonic transducers on vertical sidewall 16, more areas of the semiconductor wafers are reached by the sonic energy emanating from the sonic transducers. Such an arrangement of the sonic transducer reduces potential cancellation of, and interference between, sonic energy waves from the sonic transducers on the opposing vertical side walls 14 and 16. Although sonic transducers 36 and 38 can be operated at high power levels (e.g., above 1 W/cm$^2$), they are typically operated at a power in the range of 5 to 10 W/cm$^2$ and at a frequency in the range of 500 KHz to 2 MHz.

By employing sonic transducers on both vertical sidewalls and angled walls disposed below the vertical sidewalls, bath systems in accordance with one exemplary embodiment of the present invention are able to deliver sonic energy to the semiconductor wafers in an efficient and uniform manner. Furthermore, when the bath system is configured to receive semiconductor wafers in a semiconductor wafer cassette, the use of sonic transducers on both vertical sidewalls and angled walls disposed below the vertical sidewalls significantly reduces the "shadowing" effect otherwise present in conventional bath systems. In this regard, the two angled walls can be arranged at an angle in the range of from 1 degree to 60 degrees with respect to horizontal, thereby eliminate any "shadowing" effect. The angle at which the two angled walls are arranged is predetermined based on the design of the semiconductor wafer cassette and the distance of the angled walls therefrom, in order to provide maximum sonic energy coverage of the semiconductor wafers. For a conventional semiconductor wafer cassette with four cassette support rods, a typical angle is in the range of 6 degrees to 20 degrees.

Bath system 10 also includes a first generator 35 and a second generator 37 configured to power sonic transducers 36 and 38 as shown in FIGS. 2 and 3. For convenience, the generators are shown connected to only one of the transducers 36 and 38. However, it is understood that suitable connections are made for the generators to drive all of the transducers. The first and second generators can be operated in a multiplexed manner to power the sonic transducers using, for example, an amplifier, controller and interface system (not shown). During processing of the semiconductor wafers, sonic transducers 36 and 38 are operated in a multiplexed manner to avoid interference between sonic energy waves emanating therefrom. Such interference may cause "dead spots" on the semiconductor wafer, at which no sonic energy is delivered. The multiplexing can entail, for example, operating sonic transducers 36 and 38 in a manner such that sonic energy from a sonic transducer attached to vertical sidewall 14 does not interfere with sonic energy from a sonic transducer attached to vertical sidewall 16. This can be accomplished by configuring sonic transducers 38 such that a sonic transducer attached to vertical sidewall 14 is not operated during the same time period (typically 1 second) that an opposing sonic transducer attached to vertical sidewall 16 is operated.

Since bath system 10 includes two generators (i.e., a first generator and a second generator), the first generator can be configured to selectively power sonic transducers 38 attached to front portions 14a, 16a of vertical sidewalls 14, 16 and sonic transducers 36 attached to front portions 18a, 20a of angled walls 18, 20. The second generator can be configured to selectively power sonic transducers 38 attached to the back portions 14b, 16b of vertical sidewalls 14, 16 and sonic transducers 36 attached to back portions 18b, 20b of angled walls 18, 20. When the first and second generator are operated in a multiplexed manner, more than one sonic transducer powered by each generator can be operated on at the same time. If, for example, each of the first and second generators power two sonic transducers simultaneously, at any one time, four sonic transducers will can be operating in the bath system. However, these four sonic transducers are selected to avoid the aforementioned interference effects. The four sonic transducers that are operating at the same time period can include two sonic transducers on vertical wall 14 and two sonic transducers on vertical wall 16. However, in this circumstance the two sonic transducers operating on vertical wall 14 are offset by at least one transducer width from the two sonic transducers operating on vertical wall 16. In this manner, cancellation effects are avoided and interference between sonic energy waves emanating from opposing vertical walls is eliminated.

Once apprised of the present disclosure, one skilled in the art will recognize that any number (e.g., one, two or more) of generators can be employed and that the multiplexed manner, in which the generator(s) are operated, can be varied while still avoiding interference and cancellation effects. Similarly, the number of transducers can be varied while still avoiding interference and cancellation effects.

To demonstrate the benefits of bath systems according to the present invention, the "shadowing" effect reduction and particle removal efficiency of the bath system described with respect to FIGS. 1–3 was compared to a conventional bath system with sonic transducers only on the vertical sidewalls. Process details were as follows:

Operating frequency range—600 KHz to 750 KHz;

Cassette type—conventional semiconductor wafer cassette with four support rods;

Semiconductor wafer load—fifty 300 mm diameter hydrophilic semiconductor wafers;

Processing Liquid—35° C., recirculating 50:2:1 SC1 solution (i.e., a $H_2O$, $NH_4OH$, $H_2O_2$ solution);

Process Time—5 minutes

Semiconductor wafers processed in the conventional bath system with sonic transducers on only the vertical sidewalls exhibited horizontal stripes of particles between the semiconductor cassette carrier support rods and a particle removal efficiency of from approximately 96% to 98% (measured at >0.26 microns). On the other hand, semiconductor wafers processed in the bath system according to one exemplary embodiment of the present invention exhibited no horizontal stripes of particles between the semiconductor cassette carrier support rods and a particle removal efficiency of from approximately 98% to greater than 99% (measured at each of >0.20, >0.40 and at >0.50 microns). These results indicate that bath systems according to one exemplary embodiment of the present invention provide increased efficiency and uniformity with respect to delivery of sonic energy to the semiconductor wafers in comparison to a conventional bath system. These results also indicate that the bath systems in accordance with one exemplary embodiment of the present invention significantly eliminate the "shadowing" effect that was present in a conventional bath system. In addition, since bath systems according to the present invention are more efficient, processing time can be minimized, thus reducing the required number of bath systems, as well as the volume of processing liquid.

If desired, bath systems according to the present invention can include a dump valve and be configured to perform a quick dump rinse (QDR) process (i.e., a process that provides a quick evacuation of all the processing liquid in a container of the bath system via the dump valve). Such a dump valve can include an oval-shaped opening approximately 10 inches long and 2.5 inches wide, through which the processing liquid is evacuated. The dump valve can be optionally attached to angled walls of the container.

It should be understood that various alternatives to the embodiments of the invention described herein may be employed in practicing the invention. It is intended that the following claims define the scope of the invention and the structures within the scope of these claims and their equivalents be covered thereby.

What is claimed is:

1. A bath system for processing semiconductor wafers comprising:
    a container configured for receiving at least one semiconductor wafer and holding processing liquid, said container having two vertical sidewalls and two angled walls, each of the angled walls disposed below one of the vertical sidewalls;
    at least one sonic transducer attached to each of the angled walls and arranged so that sonic energy emanating therefrom is directed across the semiconductor wafers during processing; and
    at least one sonic transducer attached to each of the vertical sidewalls and arranged so that sonic energy emanating therefrom is directed across the semiconductor wafer during processing.

2. The bath system of claim 1, wherein the container is configured for receiving at least one 300 mm diameter semiconductor wafer.

3. The bath system of claim 1, wherein the angled sidewalls are arranged at an angle in the range of from 1 degrees to 60 degrees with respect to horizontal.

4. The bath system of claim 3, wherein the angled sidewalls are arranged at an angle in the range of from 6 degrees to 20 degrees with respect to horizontal.

5. The bath system of claim 1, wherein the sonic transducers are configured for operation in a multiplexed manner such that sonic energy emanating from the sonic transducers attached to one of the vertical sidewalls does not interfere with sonic energy emanating from the sonic transducers attached to the other vertical sidewall.

6. The bath system of claim 5, wherein sonic transducers attached to one of the vertical sidewalls are configured such that they are not operated during the same time period that opposing sonic transducers attached to the other vertical sidewall are operated.

7. The bath system of claim 1, wherein the sonic transducers attached to each of the vertical sidewalls are offset from one another.

8. The bath system of claim 7, wherein the sonic transducers attached to the vertical sidewalls are configured for operation in a multiplexed manner such that sonic energy from those sonic transducers attached to one of the vertical sidewalls does not interfere with sonic energy from those sonic transducers attached to the other vertical sidewall.

9. The bath system of claim 1 further including a first generator and a second generator, and wherein the vertical sidewalls include a front portion and a back portion and the angled walls include a front portion and a back portion, and
    wherein the first generator is configured to power those sonic transducers attached to the front portion of the vertical sidewalls and those sonic transducers attached to the front portion of the angled walls, and the second generator is configured to power those sonic transducers attached to the back portion of the vertical sidewalls and those sonic transducers attached to the back portion of the angled walls.

10. The bath system of claim 9, wherein first and second generators are operated in a multiplexed manner.

11. The bath system of claim 1 further including a dump valve, and wherein the container and dump valve are configured to perform a quick dump rinse process.

12. The bath system of claim 1 further including four sonic transducers attached to each angled wall and twelve sonic transducers attached to each vertical sidewall.

13. The bath system of claim 12, wherein the semiconductor wafer cassette includes four cassette support rods.

14. The bath system of claim 1, wherein the container is configured for receiving at least one semiconductor wafer in a semiconductor wafer cassette, the semiconductor wafer cassette including a plurality of cassette support rods, and
    wherein those sonic transducers attached to each of the angled walls are arranged so that sonic energy emanating therefrom is directed between at least two of the plurality of cassette support rods and across the semiconductor wafers during processing.

15. The bath system of claim 1, wherein the sonic transducers deliver power above 1 W/cm$^2$.

16. The bath system of claim 1 wherein the sonic transducers deliver power in the range of 5 to 10 W/cm$^2$.

17. The bath system of claim 1, wherein the sonic transducers operate in a frequency range of from 500 KHz to 2 MHz.

18. The bath system of claim 1, wherein the sonic transducers operate in a frequency range of from 650 KHz to 750 KHz.

19. A bath system for processing semiconductor wafers comprising:
    a container configured for receiving at least one 300 mm diameter semiconductor wafer in a semiconductor wafer cassette, the semiconductor wafer cassette including four cassette support rods, and holding processing liquid, said container having two vertical sidewalls and two angled walls, each of the angled walls disposed below one of the vertical sidewalls;

four sonic transducers attached to each of the angled walls and arranged so that sonic energy emanating therefrom is directed between at least two of the cassette support rods and across the 300 mm diameter semiconductor wafers during processing; and twelve sonic transducers attached to each of the vertical sidewalls and arranged so that sonic energy emanating therefrom is directed across the 300 mm diameter semiconductor wafers during processing.

20. The bath system of claim 19 further including a first generator and a second generator, and wherein the vertical sidewalls include a front portion and a back portion and the angled walls include a front portion and a back portion, and wherein the first generator is configured to power those sonic transducers attached to the front portion of the vertical sidewalls and those sonic transducers attached to the front portion of the angled walls, and the second generator is configured to power those sonic transducers attached to the back portion of the vertical sidewalls and those sonic transducers attached to the back portion of the angled walls.

21. The bath system of claim 20, wherein first and second generators are operated in a multiplexed manner.

* * * * *